US009706665B2

United States Patent
Vivet et al.

(10) Patent No.: US 9,706,665 B2
(45) Date of Patent: Jul. 11, 2017

(54) DEVICE FOR ASSEMBLING A CHIP ON A SUBSTRATE BY PROVIDING A SOLDER-FORMING MASS

(71) Applicant: VALEO ETUDES ELECTRONIQUES, Creteil (FR)

(72) Inventors: Laurent Vivet, Bois D'arcy (FR); Jean-Michel Morelle, Beaugency (FR); Sandra Dimelli, Bois D'arcy (FR); Laurent Deneu-Fontaine, Isques (FR); Romaric Lenoir, Port Rarly (FR)

(73) Assignee: VALEO ETUDES ELECTRONIQUES, Creteil (FR)

( * ) Notice: Subject to any disclaimer, the term of this patent is extended or adjusted under 35 U.S.C. 154(b) by 0 days.

(21) Appl. No.: 14/314,551

(22) Filed: Jun. 25, 2014

(65) Prior Publication Data
US 2014/0304984 A1 Oct. 16, 2014

Related U.S. Application Data

(62) Division of application No. 12/576,542, filed on Oct. 9, 2009, now Pat. No. 9,167,703.

(30) Foreign Application Priority Data

Oct. 10, 2008 (FR) .................................... 08 56876

(51) Int. Cl.
*B23P 19/00* (2006.01)
*H05K 3/34* (2006.01)
(Continued)

(52) U.S. Cl.
CPC ............. *H05K 3/34* (2013.01); *B23K 1/0056* (2013.01); *B23K 3/0607* (2013.01); *H01L 24/75* (2013.01);
(Continued)

(58) Field of Classification Search
CPC B23K 1/0056; B23K 3/0607; B23K 2201/36; H05K 3/34; H05K 3/341;
(Continued)

(56) References Cited

U.S. PATENT DOCUMENTS 3,610,508 A 10/1971 Laubmeyer
3,934,073 A 1/1976 Ardezzone
(Continued)

FOREIGN PATENT DOCUMENTS

FR 2 003 802 11/1969
FR 2 905 883 3/2008

OTHER PUBLICATIONS

French Search Report issued in corresponding French Application No. 0856876 on Mar. 9, 2009 with translation.
Feb. 12, 2015 Office Action issued in U.S. Appl. No. 12/576,542.

*Primary Examiner* — Donghai D Nguyen
(74) *Attorney, Agent, or Firm* — Oliff PLC

(57) ABSTRACT

A device for assembling an element on a surface of a substrate by providing a solder-forming mass. The device has a means for moving the element and a measurement means. The means for moving the element includes a support and an element gripper member. The gripper member has a vertical axis that is perpendicular to the surface of the substrate and is mounted to move freely in translation on the support in a direction parallel to its vertical axis. The measurement means measures a variation of the position of the element in vertical translation.

7 Claims, 3 Drawing Sheets

(51) Int. Cl.
  *B23K 1/005*  (2006.01)
  *H01L 23/00*  (2006.01)
  *B23K 3/06*   (2006.01)
  *B23K 101/36* (2006.01)

(52) U.S. Cl.
  CPC .......... *H05K 3/341* (2013.01); *B23K 2201/36* (2013.01); *H01L 2924/12042* (2013.01); *H05K 3/3494* (2013.01); *H05K 2201/10969* (2013.01); *H05K 2203/0195* (2013.01); *H05K 2203/0415* (2013.01); *H05K 2203/107* (2013.01); *H05K 2203/163* (2013.01); *Y02P 70/613* (2015.11); *Y10T 29/49144* (2015.01); *Y10T 29/53174* (2015.01); *Y10T 29/53178* (2015.01)

(58) Field of Classification Search
  CPC ....... H05K 3/3494; H05K 2201/10969; H05K 2203/0195; H05K 2203/0415; H05K 2203/107; H05K 2203/163; H01L 24/75; H01L 2924/12042; H01L 2924/00; Y10T 29/53178; Y10T 29/49144; Y10T 29/53174
  USPC ....... 29/709, 714, 720, 739, 749; 219/85.12, 219/121.12, 121.62; 228/6.2, 12, 102
  See application file for complete search history.

(56) References Cited

U.S. PATENT DOCUMENTS

| | | | |
|---|---|---|---|
| 6,204,471 B1* | 3/2001 | Kurihara .............. | B23K 1/0056 228/12 |
| 6,380,513 B1 | 4/2002 | Remy De Graffenried | |
| 6,471,110 B1* | 10/2002 | Luechinger ............ | B23K 3/08 228/102 |
| 7,359,068 B2* | 4/2008 | Yonescu ............ | G01B 11/0608 356/602 |
| 2009/0289098 A1* | 11/2009 | Terada ................... | H01L 24/75 228/12 |

* cited by examiner

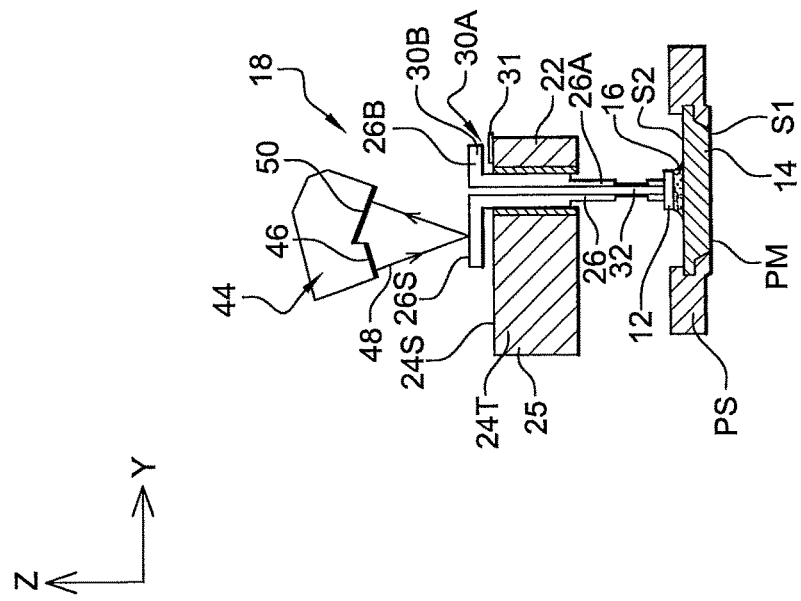
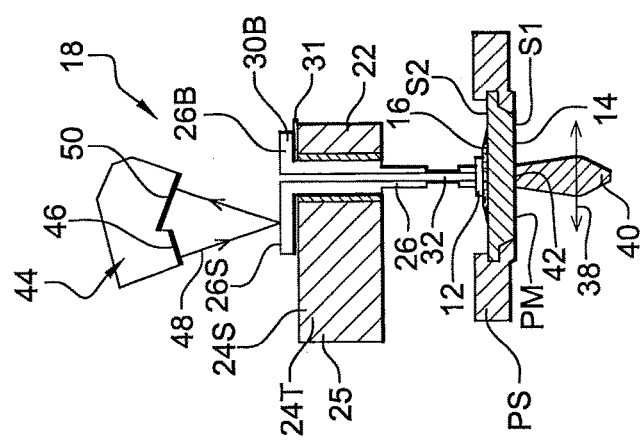
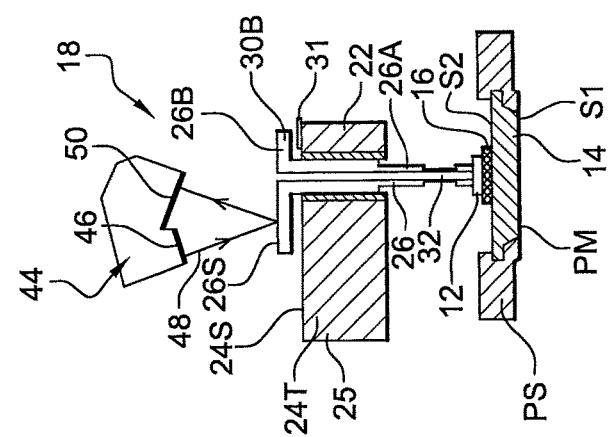

DEVICE FOR ASSEMBLING A CHIP ON A SUBSTRATE BY PROVIDING A SOLDER-FORMING MASS

RELATED APPLICATIONS

This is a Division of application Ser. No. 12/576,542, filed Oct. 9, 2009, which claims the benefit of French Patent Application No. 0856876, filed Oct. 10, 2008. The disclosure of the prior applications is hereby incorporated by reference herein in its entirety.

TECHNICAL FIELD

The present subject matter relates to the technical field of a device for soldering a member on a substrate by providing a solder-forming mass.

The subject matter relates more particularly but not specifically to a device for soldering a member on a substrate that is also configured to monitor the heating of the solder-forming mass.

BACKGROUND

In the state of the art, a known method of soldering an element, such as a chip, onto a substrate by providing a solder-forming mass, comprises:

forming a vertical stack of axis coinciding substantially with the gravity direction and comprising, from top to bottom: the element; the mass in the solid state; and the substrate; and heating the mass so as to cause it to pass into a liquid state enabling it to spread on the substrate.

The quality of the soldering depends in particular on the wettability properties of the surface of the substrate that ensure good wetting of the substrate by the mass, i.e. that it spreads sufficiently. More precisely, the wettability of the surface is defined by a contact angle, also known as the wetting angle, that is formed between the tangent to the surface of the mass and the tangent to the surface of the substrate at the point of contact between the mass and the substrate.

In order to ensure good wetting of the mass on the substrate, it is desirable to increase the duration of the period during which the mass is in its liquid state, e.g. by lengthening the duration over which the mass is heated in order to ensure that it spreads sufficiently over the substrate.

Unfortunately, although the duration of heating can be determined relatively easily, it is difficult to determine accurately the duration of the period during which the mass was indeed in its liquid state.

By way of example, the mass may be heated by irradiating it with a continuous laser source that is controlled to produce long pulses, e.g. of a duration greater than about 2 seconds (s).

Under such circumstances, the length of time heat propagates through the substrate and the mass is no longer negligible compared with the duration of a laser pulse that corresponds to the duration of the heat being applied.

Consequently, the duration of the period during which the mass is actually in its liquid state does not necessarily correspond to the duration of the heat being applied.

SUMMARY

A particular object of the subject matter is to provide a method of assembling an element on a substrate by providing a solder-forming mass, which method makes it possible to monitor accurately the duration of the period during which the mass is in its liquid state, so as to optimize wetting of the substrate by the mass.

To this end, the subject matter provides a method of assembling an element, such as a chip, on a substrate by providing a solder-forming mass, the method comprising:

forming a vertical stack of axis coinciding substantially with the gravity direction and comprising, from top to bottom: the element; the mass in the solid state; and the substrate; and heating the mass so as to cause it to pass into a liquid state enabling it to spread on the substrate;

wherein, after the stack has been formed, the element is left free to move vertically, and wherein, during heating, variation in the vertical position of the element is measured.

The mass is a self-supporting mass, i.e. a mass which is independent from the element and the substrate and which is separately placed on the stack.

By means of this method, it is possible to know accurately the length of time during which the mass is in its liquid state. So long as the mass is in the solid state, it exerts a reaction force on the element that compensates for the gravity force exerted by the member on the mass. The element is therefore stationary.

Then, during heating, the mass liquefies and the magnitude of the reaction force exerted by the mass on the element becomes less than the magnitude of the gravity force exerted by the element on the mass, thereby causing the element to move towards the substrate under the action of gravity.

It is thus possible to determine how the state of the mass varies by measuring variation in the movement of the member.

An assembly method of the subject matter may also include one or more of the following characteristics:

the element is left free to move vertically downwards and upwards;

heating of the mass is stopped as a function of a parameter depending on the measurement of variation in the vertical position of the element;

during heating, stabilization of the vertical position of the element following a downward movement of the element is detected, and heating of the mass is stopped after a predetermined duration measured from the detection of stabilization; and in order to heat the mass, a laser beam is directed against a first face of the substrate opposite from a second face of the substrate carrying the mass, the beam being directed in register with the mass.

The subject matter also provides a device for assembling an element on a substrate by providing a solder-forming mass, the device comprising means for moving the element, said means comprising a support carrying an element gripper member, wherein the gripper member is mounted to move freely in translation on the support parallel to an axis referred to as "vertical" for movement in translation, and wherein it includes measurement means for measuring variation of the position of the element in vertical translation.

An assembly device may also include one or more of the following characteristics:

the device includes heater means and control means for controlling the heater means as a function of the variation in the position of the element;

the device includes means for limiting the stroke of the element in vertical translation;

the device includes counterweight-forming means opposing the weight of the gripper member, at least in part;

the measurement means for measuring variation in the position of the element are means for measuring variation of the position of the gripper member in vertical translation;

the measurement means comprise means for emitting an incident light beam and deigned to emit a beam onto a surface of the gripper member that is substantially perpendicular to the vertical axis, and means for receiving a portion of the beam reflected by said surface; and the measurement means comprise a laser triangulation movement sensor.

BRIEF DESCRIPTION OF THE DRAWINGS

The subject matter can be better understood on reading the following description given purely by way of example and with reference to the drawings, in which:

FIGS. 3-5 are face views of the FIG. 1 assembly installation showing different steps in the assembly method.

DETAILED DESCRIPTION OF THE EMBODIMENTS

Figure 1:
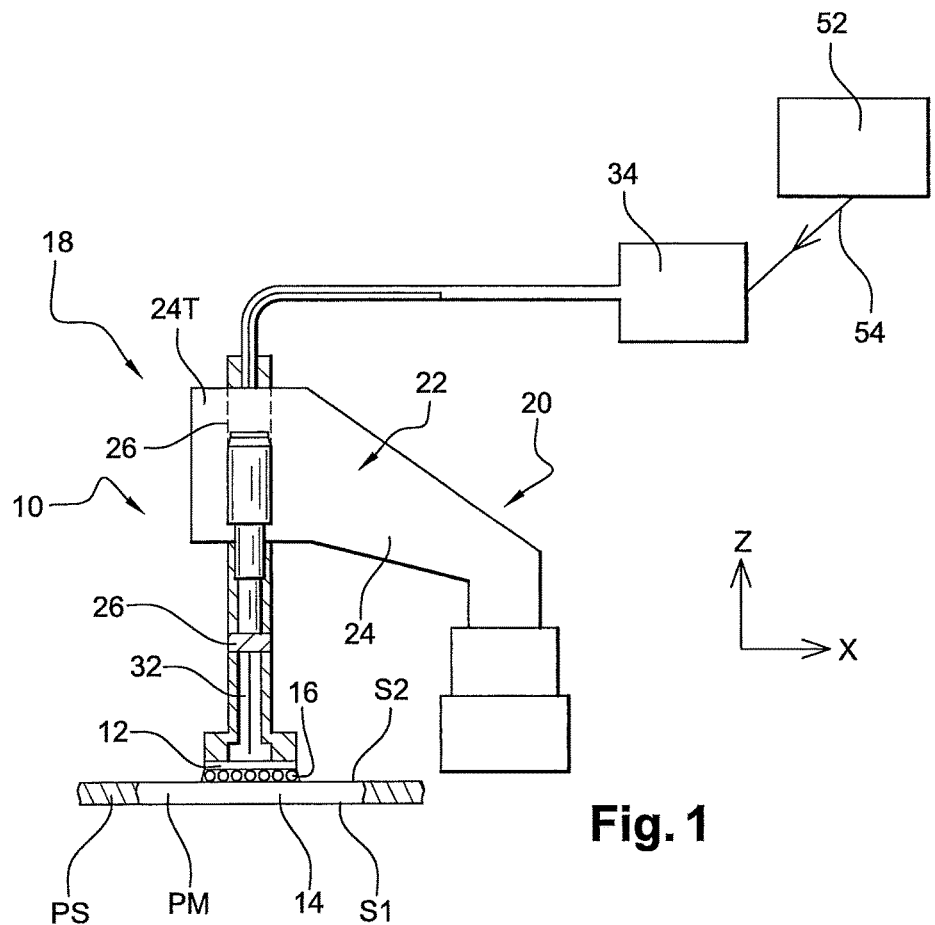
FIG. 1 is a side view of an installation for assembling an element on a substrate, the installation comprising an assembly device for implementing the assembly method.
Figure 2:
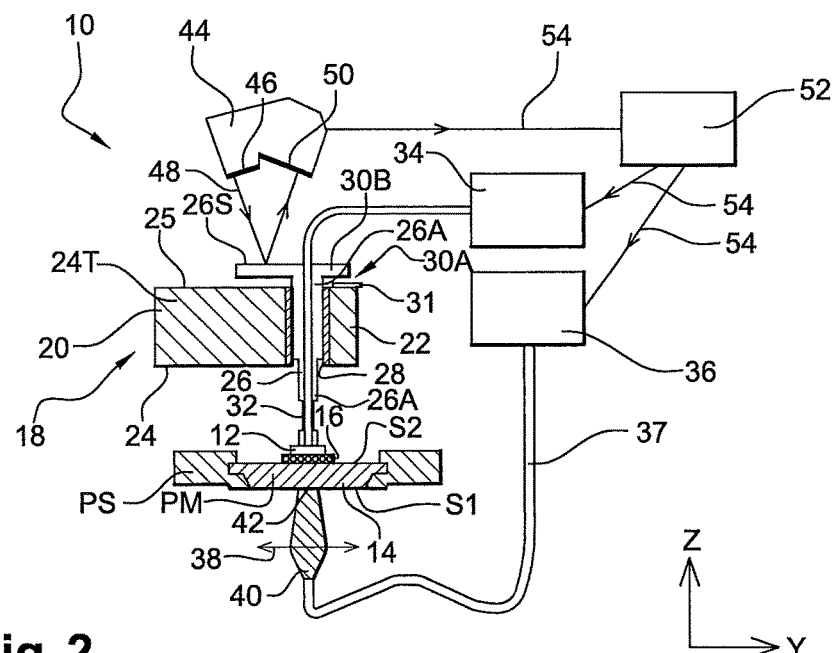
FIG. 2 is a face view of the installation illustrated in FIG. 1.

FIGS. 1 and 2 show an installation given overall reference 10. The installation 10 serves to assemble an element 12 on a substrate 14 by supplying a mass 16 constituting solder material. In the example described, the element 12 is a conventional semiconductor chip. By way of example, the mass 16 is a self-supporting mass independent from the element 12 and the substrate 14 and may be in the form of a solder paste or of a fine tape cut into the shape of a disk or a rectangle.

The substrate 14 in the example described comprises a metal portion PM, in particular made of copper, surrounded by part by a portion PS made of synthetic material, that forms a portion of a package for protecting the semiconductor chip 12 carried by the substrate 14. The substrate 14 has opposite first and second faces S1 and S2. The mass 16 is designed to be carried by the second face S2 of the metal portion PM of the substrate. Preferably, the second face S2 is covered in a fine layer of nickel.

In order to assemble the chip 12 on the substrate 14, the assembly installation 10 comprises an assembly device 18. The assembly device 18 includes mover means 20 for moving the chip 12 or the mass 16 in such a manner as to place the mass on the second face S2 of the substrate 14.

These mover means 20 comprise hinged means 22 enabling the chip 12 or the mass 16 to be moved in a horizontal plane substantially parallel to axes X and Y and in a vertical direction substantially parallel to an axis Z.

In particular, the hinged means 22 in this example comprise an arm 24 having a head 24T. The head 24T comprises a support 25 carrying a gripper member 26 for gripping the chip 12 or the mass 16.

More particularly, the member 26 is mounted to move freely in translation on the support 25 parallel to an axis for movement in translation substantially parallel to the Y axis, and that is referred to as being vertical.

For example, the gripper member 26 is connected to the head 24T by means of a slideway connection. For this purpose, the head 24T includes a through hole 28 for guiding the member 26.

Thus, by way of example, the gripper member 26 is generally T-shaped having a first portion 26A forming the leg of the T-shape and a second portion 26B forming the cross-bar of the T-shape. The first portion 26A is preferably generally complementary in shape to the inside wall 281 of the hole 28, thus enabling the gripper member 26 to slide inside the hole 28. By way of example, the friction force generated when the member 26 moves in translation inside the hole 28 has a value less than ten grams-force.

Preferably, the device 18 includes limiter means 30 for limiting the vertical translation stroke of the member 26, and thus more precisely for limiting the stroke of the chip 12 that is to be carried by the member 26. For example, the limiter means 30 comprise a first stop-forming element 30A formed on the support 25 and a second stop-forming element 30B formed by one of the ends of the second portion 26B of the member 26, the stop-forming elements 30A and 30B being designed to come into contact with each other when the gripper member 26 moves in the direction of the vertical axis Y in order to limit the stroke of the member 26.

For example, the first element 30A is formed by a spacer 31 for extending over a surface 25S of the support 25 of the head 24T.

Furthermore, the gripper member 26 operates by suction, for example. Thus, the gripper member 26 includes a suction duct 32 connected at one of its ends to suction means 34, e.g. comprising a vacuum pump. The suction duct 32 extends inside a through hole in the gripper member 26 in its longitudinal direction, with the other end of the duct 32 opening out to an end of the gripper member 26 that is designed to come into contact with the chip 12 that is being assembled on the substrate 14.

Preferably, the gripper member 26 is suitable for being secured to the head 24T with the help of releasable connection means suitable for taking up an active state in which the member 26 is securely connected to the head 24T, and a rest state in which the member 26 is free relative to the head 24T.

In the example described, the device 18 also has counterweight-forming means (not shown) co-operating with the gripper member 26. Thus, these counterweight-forming means counter the weight of the gripper member 26 at least in part, and preferably completely. Nevertheless, the residual weight corresponding to the sum of the weight of the gripper member 26 compensated at least in part by the counterweight-forming means plus the weight of the chip 12 carried by the gripper member 26 must be slightly greater than the friction force generated while the member 26 is moving in translation inside the hole 28.

In order to heat the mass 16 and cause the solder to melt, the installation 10 includes heater means 36, e.g. comprising a continuous laser source that is controlled to produce pulses of predetermined duration, e.g. equal to 2 s, an optical fiber 37 for guiding a laser beam 40 emitted by the laser source, and means 38 for focusing the laser beam 40 on a point 42 in register with the solder-forming mass 16.

The device 18 also has means 44 for measuring variation in the movement in vertical translation of the position of the chip 12. These measurement means 44 are means for measuring variation in the movement in vertical translation of the position of the gripper member 26.

Preferably, the measurement means 44 comprise emitter means 46 for emitting an incident light beam for emitting a beam 48 onto a surface 26S of the gripper member 26 that is substantially perpendicular to the axis Y, and means 50 for receiving a fraction of the beam 48 reflected by said surface 26S.

Preferably, the measurement means 44 comprise a laser-triangulation movement sensor. Thus, the emitter means 46 comprise an infrared laser source together with means for focusing the incident beam 48 emitted by the laser source on the surface 26S. The receiver means 50 preferably comprise a charge-coupled device (CCD) cell. To measure the movement of the member 26, variation is measured in the position of the point of impact of the reflected beam 48 on the CCD cell, this variation being linked to variation in the position of the surface 26S of the member 26.

The surface 26S preferably extends over the top face of the second portion 26B of the member 26.

These means 44 are capable of measuring variation in the position of the member 26 along an axis perpendicular to the surface 26S of the member with accuracy of 1 micrometer ($\mu m$), and they operate with acquisition at a high frequency (about 5 kilohertz (kHz)).

Similarly, the movement means 22 enable the member 26 to be positioned with accuracy of about 1 $\mu m$.

The installation 10 also has means 52 for controlling heater means 36 as a function of the variation in the position of the element 12 or 16. For this purpose, the device 18 has conventional communications means 54 (by wire, infrared, etc.) operating between the measurement means 44, the heater means 36, and the movement means 22.

There follows a description of the main aspects of the assembly method implemented in the above-described assembly installation.

Initially, a vertical stack 56 of axis Y coinciding substantially with the weight direction is foamed comprising, from top to bottom: the chip 12, the mass 16 in a solid state, and the substrate 14.

To form this stack 56, the hinged arm 22 moves the gripper member 26 secured to the head 24T, and the control means 52 activate the suction means 34 so that the mass 16 is gripped by the member 26 by suction and then moved towards the substrate 14 by the hinged arm 22.

The movement of the gripper member 26 is relatively accurate since it is directly linked with the movement of the hinged means 22.

As soon as the mass 16 is detected as being in its contact position with the surface S2 of the substrate 14, the suction means 34 are deactivated so that the gripper member 26 releases the mass 16 on the substrate 14.

Then, during a second step, the chip 12 is placed on the mass 16 by proceeding in the same manner.

As soon as the chip 12 is detected as being in its contact position with the mass 16, the releasable means connecting the head 24T with the gripper member 26 are released so that the member 26 is free to move in translation along the hole 28 in the head 24T.

In this position, the second portion 26B of the gripper member 26 is situated above the spacer 31 and the distance along the vertical axis Y between the spacer 31 and the second portion 26B defines a maximum stroke for the member 26 moving in translation. The magnitude of this stroke is selected so as to enable measurement of variation in the height of the member 26 to be measured with sufficient accuracy while preserving the quality of the soldering. A stroke of too great a magnitude would run the risk of causing the mass to be expelled sideways from the chip, and thus forming a solder joint of reduced thickness under the chip 12.

By way of example, this distance is equal to 2.5 $\mu m$ and it corresponds substantially to the variation in the height of the mass 16 relative to the substrate 14 that occurs when the mass changes from its solid state to its liquid state. Nevertheless, it should be observed that a stroke for the member 26 equal to 10 $\mu m$ enables relatively accurate measurements to be obtained of the variation in height without running the risk of causing the mass to be expelled sideways from the chip 12 while the chip 12 is moving against the mass.

The control means 52 control initiation of the heating of the mass 16. For this purpose, the mass 16 is heated to a predetermined temperature for a predetermined duration, e.g. corresponding to the duration of one laser pulse. For this purpose, the laser beam 40 is directed against the first face S1 of the substrate. More precisely, the laser beam 40 is directed in register with the mass 16 for a period of irradiating the substrate 14 by the beam 40. This irradiation period corresponds substantially to the predetermined duration for heating the mass 16.

During a period T1, the temperature of the mass 16 increases without its state changing. During this period, the mass 16 exerts a reaction force on the chip 12 serving substantially to compensate the gravity force exerted by the chip 12 on the mass 16.

Then, during a period T2, the mass 16 passes from a solid state to a liquid state, thereby enabling it to spread over the substrate 14 as can be seen in FIG. 4. The magnitude of the reaction force exerted on the chip 12 by the mass 16 in the liquid state decreases.

Thus, during this period T2, because the gripper member 26 is mounted to move freely in translation along the hole 28 in the head 24T, the gripper member 26 moves downwards in translation along the direction of the vertical axis Y that also corresponds to the gravity direction, under drive from the weight of the chip 12 and a residual portion of its own weight (not compensated by the counterweight-forming means), the gripper member sliding along the hole 28 in the head 24T.

The at least partial compensation of the weight of the member 26 by the counterweight-forming means serves to limit the pressure exerted by the chip 12 on the liquid mass 16 during the heating step, thereby avoiding any risk of the mass flowing onto the sides of the chip, 12 and of the chip 12 being pressed directly against the substrate 14.

The measurement means 44 detect the variation in the position of the gripper member 26, thereby making it possible to deduce that there has been a variation in the position of the chip 12.

The downward movement of the chip 12 along the axis Y stops when the mass 16 is entirely in the liquid state, as occurs when the end of the second portion 26B of the member 26 brings the member 26 into abutment against the spacer 31 extending on the head 24T. The chip 12 is then stabilized.

The measurement means 44 then detect that the vertical position of the chip 12 has stabilized subsequent to the chip 12 moving downwards, and delivers a signal to the control means 52 that, starting from this instant of stabilization being detected, trigger a timer to measure the predetermined duration. This predetermined duration is equal to about 1 s.

As a result, the control means 52 maintain the activation of the heater means 36 heating the mass 16 during the predetermined duration measured from the time the position of the chip 12 is stabilized.

At the end of this predetermined duration, the control means 52 stop the heating. The position of the chip 12 does not vary so long as the mass 16 continues to remain liquid after heating has stopped. The period during which the mass 16 is in the liquid state corresponds to the period T3. This period T3 corresponds to the period during which the position of the chip 12 is stabilized.

Thereafter, the mass 16 begins to solidify, as shown in FIG. 4. This solidification stage corresponds to a period T4.

As it solidifies, the reaction force exerted by the mass 16 on the chip 12 increases, thereby causing the chip 12 to rise a little in the vertical direction, as can be seen in FIG. 5.

Once the mass 16 has solidified completely, the position of the chip stabilizes, corresponding to the period T5.

Thus, when the measurement means 44 detect that the chip 12 has stabilized in a high position in the Y direction, they send a signal to the control means 52 so that they cause the suction means 34 to stop. The chip 12 is thus released.

Figure 6:
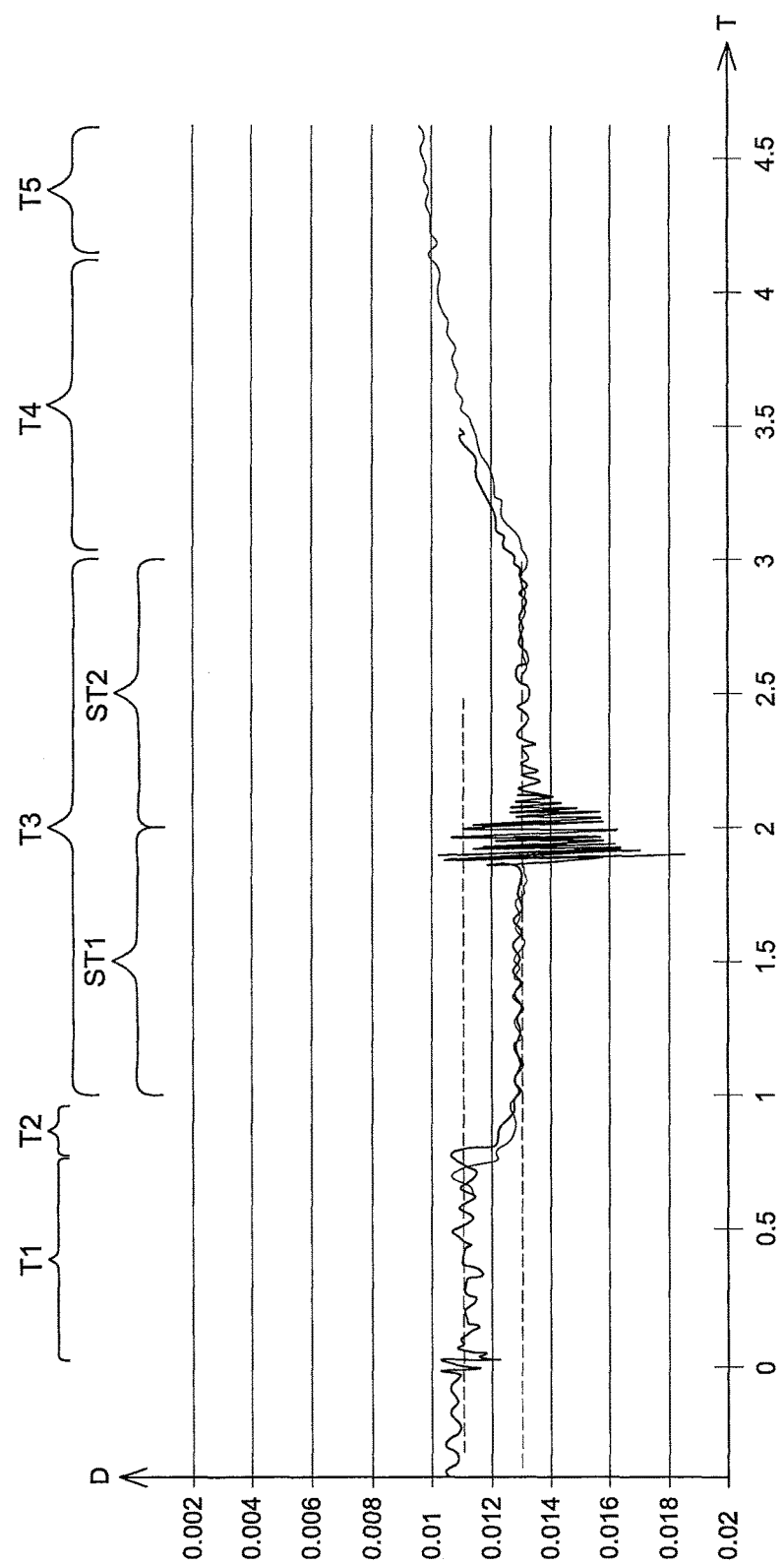
FIG. 6 is a graph plotting a curve showing how the position of the element varies as a function of time.

At the end of these various steps, the measurement means 44 produce the graph of FIG. 6 plotting a curve C showing how the position of the chip 12 has varied over time. Time T in seconds (s) is plotted along the abscissa of the graph and distance D in millimeters (mm) is plotted up its ordinate.

Thus, the curve C comprises:

a first portion T1 of zero slope corresponding to the above-described period T1;

a second portion T2 of negative slope corresponding to the period T2during which the chip 12 moves downwards towards the substrate 14 as a result of the mass 16 liquefying;

a third portion T3 of zero slope corresponding to the period T3 during which the chip 12 stabilizes. This period T3 is subdivided into a first part ST1 during which the heating of the mass 16 is maintained, and a second part ST2 during which the heating is stopped, with the mass 16 still remaining in the liquid state;

a fourth portion T4 of positive slope corresponding to the period T4 during which the mass 16 begins to solidify, thereby causing the chip 12 to move back up; and a fifth portion T 5 of zero slope corresponding to the period T5 in which the chip 12 is stabilized after it has moved up along the axis Y.

Thus, in order to obtain the duration of wetting from the graph of FIG. 6, wetting duration corresponds substantially to the length of time the chip 12 is stabilized after it has moved downwards, i.e. the duration of the period T3.

This method thus makes it possible to determine with great accuracy the duration for which the substrate was wetted by the mass 16 by observing variations in the position of the chip 12.

In particular, the duration of the period during which the mass 16 is in the liquid state has some minimum value that is controlled and programmable.

Furthermore, for each operation of assembling a chip on a substrate, a graph is recorded that comprises the curve describing the main stages as specified above. By means of this curve, it is possible to observe any abnormal departure from desired values for the durations of each of the distinct identified periods.

It is also possible to monitor the duration of the stage during which the mass 16 solidifies and to determine when this stage is too long. Solidification for a duration that is too long can be harmful to the quality of the solder joint formed by the solidified mass.

Furthermore, it is possible to determine with great accuracy the instant at which solidification of the mass is complete. This makes it possible to save time in an assembly operation since the gripper member can release the chip at this instant without running any risk of unwanted movement of the chip on the mass, since the mass in the solid state ensures excellent adhesion between the chip and itself.

What is claimed is:

1. A device for assembling an element on a surface of a substrate by providing a solder-forming mass, the device comprising:

a means for moving the element, the means comprising a support configured to carry a gripper member; and a measurement means;

wherein:

the gripper member is mounted on the support and has a vertical axis that is perpendicular to the surface of the substrate;

the gripper member includes a suction duct configured to move freely in translation through the support in a direction parallel to the vertical axis of the gripper member;

the gripper member is a T-shape having a first portion configured to allow the gripper member to move freely in translation through the support, and a second portion forming a cross-bar of the T-shaped gripper member that is disposed outside of the support; and the measurement means is configured to measure a variation of the position of the element in vertical translation, wherein the measurement means further comprising a laser triangulation movement sensor.

2. The device according to claim 1, further comprising a heater means and a control means configured to control the heater means as a function of the variation in the position of the element.

3. The device according to claim 1, further comprising a means for limiting a stroke of the element in vertical translation.

4. The device according to claim 1, further comprising a counterweight-forming means configured to oppose the weight of the gripper member, at least in part.

5. The device according to claim 1, wherein the measurement means is configured to measure the variation in the position of the element by measuring a variation of the position of the gripper member in vertical translation.

6. The device according to claim 5, wherein:

the measurement means further comprises a means for emitting an incident light beam and a means for receiving an incident light beam;

the means for emitting an incident light beam is configured to emit a beam onto a surface of the gripper member that is substantially perpendicular to the vertical axis of the gripper member; and the means for receiving an incident light beam is configured to receive a portion of the beam reflected by the surface of the gripper member.

7. The device according to claim 1, further comprising a heater means configured to heat the element from below the gripper member.

* * * * *